United States Patent
Kobayashi

(10) Patent No.: US 7,371,588 B2
(45) Date of Patent: May 13, 2008

(54) METHOD OF MANUFACTURING A SEMICONDUCTOR DEVICE

(75) Inventor: Motoki Kobayashi, Minato-ku (JP)

(73) Assignee: Oki Electric Industry Co., Ltd., Tokyo (JP)

(*) Notice: Subject to any disclaimer, the term of this patent is extended or adjusted under 35 U.S.C. 154(b) by 84 days.

(21) Appl. No.: 11/155,479

(22) Filed: Jun. 20, 2005

(65) Prior Publication Data
US 2006/0057744 A1   Mar. 16, 2006

(30) Foreign Application Priority Data
Sep. 13, 2004   (JP) ............... 2004-264819

(51) Int. Cl.
*H01L 21/00* (2006.01)
(52) U.S. Cl. .................... 438/3; 257/E21.664
(58) Field of Classification Search .............. 438/3, 438/E21.664; 257/296, E21.665, 295, E21.664
See application file for complete search history.

(56) References Cited

U.S. PATENT DOCUMENTS

| | | | | | |
|---|---|---|---|---|---|
| 5,776,356 | A | * | 7/1998 | Yokoyama et al. ........... 216/76 |
| 5,792,672 | A | * | 8/1998 | Chan et al. .................. 438/622 |
| 6,316,797 | B1 | * | 11/2001 | Van Buskirk et al. ...... 257/295 |
| 6,436,838 | B1 | * | 8/2002 | Ying et al. .................. 438/710 |
| 6,541,380 | B2 | * | 4/2003 | Ying et al. .................. 438/689 |
| 6,682,944 | B2 | * | 1/2004 | Kikuchi et al. ................ 438/3 |
| 6,746,878 | B2 | * | 6/2004 | Komuro et al. ................ 438/3 |
| 2002/0076936 | A1 | * | 6/2002 | Iguchi ........................ 438/710 |
| 2002/0117701 | A1 | * | 8/2002 | Sun et al. .................... 257/295 |
| 2002/0119669 | A1 | * | 8/2002 | Ono et al. ................... 438/710 |
| 2003/0119211 | A1 | * | 6/2003 | Summerfelt et al. ........... 438/3 |
| 2003/0166326 | A1 | * | 9/2003 | Kikuchi et al. ............. 438/396 |
| 2003/0227046 | A1 | * | 12/2003 | Ando et al. ................. 257/310 |
| 2003/0235944 | A1 | * | 12/2003 | Okita ......................... 438/206 |
| 2004/0129670 | A1 | * | 7/2004 | Kweon et al. ................ 216/22 |
| 2004/0157459 | A1 | * | 8/2004 | Ying et al. .................. 438/706 |
| 2004/0196618 | A1 | * | 10/2004 | Komuro et al. .......... 361/306.3 |
| 2006/0071258 | A1 | * | 4/2006 | Tomioka et al. ............ 257/296 |

FOREIGN PATENT DOCUMENTS

| JP | 09-251983 | 9/1997 |
|---|---|---|
| JP | 09-266200 | 10/1997 |

* cited by examiner

*Primary Examiner*—B. William Baumeister
*Assistant Examiner*—Igwe U. Anya
(74) *Attorney, Agent, or Firm*—Volentine & Whitt, P.L.L.C.

(57) ABSTRACT

A method of manufacturing a semiconductor device includes: forming a circuit element on a semiconductor substrate; forming a first insulation film on top to cover the circuit element; forming a first electrode on top; forming a ferroelectric film on the first electrode; forming a second electrode on the ferroelectric film; forming a mask film on the second electrode; etching the second electrode with the semiconductor substrate or a mounting electrode set to a first temperature using the mask film as a mask; etching the ferroelectric film with the semiconductor substrate or the mounting electrode set to a second temperature using the mask film as a mask, the second temperature being lower than the first temperature; and etching the first electrode with the semiconductor substrate or the mounting electrode set to a third temperature using the mask film as a mask, the third and first temperatures being approximately the same.

14 Claims, 18 Drawing Sheets

EVALUATION RESULTS ON REMANENCE POLARIZATION AMOUNT AND LEAK CURRENT OF CAPACITOR DEPENDING ON CONDITION OF ETCHING OF SBT

| TEMPERATURE OF LOWER ELECTRODE IN SBT ETCHING (°C) | REMANENCE POLARIZATION AMOUNT [$\mu C/cm^2$] | LEAK CURRENT [$A/cm^2$] |
|---|---|---|
| 80 | 12.2 | 1.6 E-4 |
| 350 | 12.1 | 1.6 E-4 |
| 450 | 12.5 | 3.7 E-3 |

DAMAGED LAYER OF LARGE-SIZE CAPACITOR

DAMAGED LAYER

Fig. 5A

EVALUATION RESULTS ON REMANENCE POLARIZATION AMOUNT OF CAPACITOR DEPENDING ON CONDITIONS OF ETCHING OF UPPER ELECTRODE

| ETCHING CONDITIONS OF UPPER ELECTRODE (Pt) | REMANENCE POLARIZATION AMOUNT OF CAPACITOR IN EACH SIZE [$\mu C/cm^2$] | | |
|---|---|---|---|
| | ELECTRODE AREA 625 $\mu m^2$ | ELECTRODE AREA 64 $\mu m^2$ | ELECTRODE AREA 16 $\mu m^2$ |
| MIXED GAS OF $Cl_2/O_2/Ar$ | 13.9~14.8 | 7.7~10.3 | 7.3 |
| MIXED GAS OF $Cl_2/O_2$ | 14.1~14.9 | 8.2~12.6 | 7.2~8.4 |

Fig. 5B

EVALUATION RESULTS ON REMANENCE POLARIZATION AMOUNT OF CAPACITOR
DEPENDING ON CONDITIONS OF ETCHING OF LOWER ELECTRODE

| ETCHING CONDITIONS OF LOWER ELECTRODE (Pt/IrO2/Ir/TiAlN) | REMANENCE POLARIZATION AMOUNT OF CAPACITOR IN EACH SIZE [$\mu C/cm^2$] | | |
|---|---|---|---|
| | ELECTRODE AREA 625 $\mu m^2$ | ELECTRODE AREA 64 $\mu m^2$ | ELECTRODE AREA 16 $\mu m^2$ |
| MIXED GAS OF Cl2/O2/Ar | 13.9~14.8 | 7.7~10.3 | 7.3 |
| MIXED GAS OF Cl2/O2 | 14.1~15.1 | 8.4~10.0 | 7.2~8.1 |

Fig. 5C

EVALUATION RESULTS ON REMANENCE POLARIZATION AMOUNT AND LEAK CURRENT OF CAPACITOR DEPENDING ON CONDITION OF ETCHING OF SBT

| TEMPERATURE OF LOWER ELECTRODE IN SBT ETCHING (°C) | REMANENCE POLARIZATION AMOUNT [$\mu C/cm^2$] | LEAK CURRENT [$A/cm^2$] |
|---|---|---|
| 80 | 12.2 | 1.6 E-4 |
| 350 | 12.1 | 1.6 E-4 |
| 450 | 12.5 | 3.7 E-3 |

METHOD OF MANUFACTURING A SEMICONDUCTOR DEVICE

CROSS-REFERENCE TO RELATED APPLICATIONS

This application claims priority to Japanese Patent Application No. 2004-264819. The entire disclosure of Japanese Patent Application No. 2004-264819 is hereby incorporated herein by reference.

BACKGROUND OF THE INVENTION

1. Field of the Invention

The present invention generally relates to a method of manufacturing a semiconductor device. More specifically, the present invention relates to a method of manufacturing a semiconductor device that includes a ferroelectric capacitor.

2. Background Information

Conventional semiconductor memories that use ferroelectrics as capacity insulators of capacitors are disclosed in Japanese Patent Application Laid Open No. H05-299610, especially pp. 8-10, FIGS. 20 and 83 (hereinafter reference 1), Japanese Patent Application Laid Open No. H09-266200, especially pp. 3-4, FIG. 1 (hereinafter reference 2), and Japanese Patent Application Laid Open No. H09-251983, especially pp. 2-3, FIGS. 1 and 2 (hereinafter reference 3), for instance. Japanese Patent Application Laid Open Nos. H05-299610, H09-266200, and H09-251983 are hereby incorporated by reference.

The reference 1 discloses an etching method of a laminated structure film that is provided with a plug electrode, a lower electrode, a ferroelectric film, and an upper electrode. The plug electrode, the lower electrode, the ferroelectric film, and the upper electrode are sequentially formed and then dry-etched in the block using a resist as a mask. Here, the plug electrode is made of a titanium nitride (TiN) film that is formed on a surface of an insulation film while also being embedded in an aperture formed in the insulation film. The lower electrode is made of platinum (Pt), the ferroelectric film is made of a PZT (lead titanate-lead zirconate: $PbTiO_3$—$PbZrO_3$). Further, the upper electrode is made of Pt, TiN, tungsten (W), aluminum (Al), or the like. In this method, by embedding the TiN film in the aperture of the insulation film while also forming the TiN film on the surface of the insulation film, the lower electrode, the ferroelectric film, and the upper electrode can be made flat. Thereby, the interval between the upper electrode and the lower electrode can be maintained at a predetermined distance, due to which flowing of leak current between the upper electrode and the lower electrode can be prevented.

The reference 2 discloses an etching method of a laminated structure film that is provided with an under layer Pt electrode, a ferroelectric film, an upper layer Pt electrode, and a titanium (Ti) film. The under layer Pt electrode, the ferroelectric film, the upper layer Pt electrode, and the Ti film are sequentially formed, and the Ti film is patterned into a predetermined pattern. Then, using the patterned Ti film as a mask, the under layer Pt electrode, the ferroelectric film, the upper layer Pt electrode, and the Ti film are continuously dry-etched in the block by a dry etching method that uses a plasma of mixed gas including $Cl_2$ and $O_2$. In etching the laminated structure film, by using the Ti film, which can be easily oxidized, as the etching mask, the etching rate becomes slow due to the oxidization of the Ti film. On the other hand, the etching rate with respect to the etching subject films (i.e. the under layer platinum electrode, the ferroelectric film, and the upper layer platinum film) can be sufficiently secured, and thereby, the selection ratio between the etching subject films and the etching mask can be enlarged. By this arrangement, processing accuracy can be improved.

The reference 3 discloses an etching method of a laminated structure film that is provided with a lower electrode made of an $Ir/IrO_2$ film, a PZT film and an upper electrode made of an $Ir/IrO_2$ film. In this etching method, the PZT film is dry-etched using mixed gas including $BCl_3$ and $Cl_2$. By this arrangement, it is possible to prevent possible removal of a desired substance from the etching surface. Moreover, for the dry etching of $Ir/IrO_2$, by using the mixed gas of $BCl_3$ and $Cl_2$ where fluoride is being added, it is possible to prevent Ir from being reattached to a side wall of a resist.

However, with regards to the etching methods of the references 1 and 2, in a method of manufacturing a capacitor by processing a laminated structure film made of an upper electrode, a ferroelectric film, and a lower electrode in the block, a damaged layer may be formed in the ferroelectric film. This damaged layer is formed by $Cl_2$ having a reducing nature when the ferroelectric film and/or the lower electrode are dry-etched. The damaged layer is formed in a way that advances inside the ferroelectric film from the side of the ferroelectric film that is exposed after the processing. In the damaged layer, the original dielectric polarization property of the ferroelectric film can be lost, or the damaged layer can turn to a path that allows current leak from the upper electrode to the lower electrode. As a result, there is a possibility that effective polarization properties may not be acquired with respect to the capacitor area. Even with a capacitor of small area or a capacitor of large area, a damaged layer is formed approximately in the same size. Therefore, especially when the area of the capacitor becomes smaller, the rate of the area occupied with the damaged layer becomes larger with respect to the effective area of the capacitor, and this allows characteristic degradation such as degradation of dielectric polarization properties, increase in current leaks, etc. to occur easily. Therefore, when it comes to a ferroelectric capacitor that is miniaturized for high integration, the rate of the area occupied with the damaged layer with respect to the effective area of the capacitor will become much larger, and it is considered that the problems of degradation of dielectric polarization properties and increases in current leaks will become more apparent.

Incidentally, the reference 3 does not mention any problem that can be caused by dry-etching the laminated structure film in the block in forming the ferroelectric capacitor.

In view of the above, it will be apparent to those skilled in the art from this disclosure that there exists a need for an improved method of manufacturing a semiconductor device. This invention addresses this need in the art as well as other needs, which will become apparent to those skilled in the art from this disclosure.

SUMMARY OF THE INVENTION

It is therefore an object of the present invention to resolve the above-described problems, and to provide an improved method of manufacturing a semiconductor device which enables etching of an electrode in high-speed, downsizing of a capacitor, and controlling of a leak current resulting from a deterioration of a ferroelectric film.

In accordance with first aspect of the present invention, a method of manufacturing a semiconductor device includes the steps of: forming a circuit element in or on a semiconductor substrate; forming a first insulation film on the semiconductor substrate, the first insulation film covering the circuit element; forming a first electrode on the first insulation film; forming a ferroelectric film on the first electrode; forming a second electrode on the ferroelectric film; forming a mask film on the second electrode, the mask film having a predetermined pattern; etching the second electrode under the condition that the temperature of the semiconductor substrate or a mounting electrode is set to a first temperature, while using the mask film as a mask, the semiconductor substrate mounting on the mounting electrode; etching the ferroelectric film under the condition that the temperature of the semiconductor substrate or the mounting electrode is set to a second temperature, while using the mask film as a mask, the second temperature being lower than the first temperature; and etching the first electrode under the condition that the temperature of the semiconductor substrate or the mounting electrode is set to a third temperature, while using the mask film as a mask, the third temperature being approximately the same as the first temperature.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure:

FIG. 5A is a view of a table showing evaluation results on a remanence polarization amount of a capacitor depending on the condition of etching an upper electrode;

FIG. 5B is a view of a table showing evaluation results on a remanence polarization amount of a capacitor depending on the condition of etching an lower electrode;

FIG. 5C is a view of a table showing evaluation results on a remanence polarization amount of a capacitor depending on the condition of etching an SBT film.

DETAILED DESCRIPTION OF THE PREFERRED EMBODIMENTS

Figure 1A:
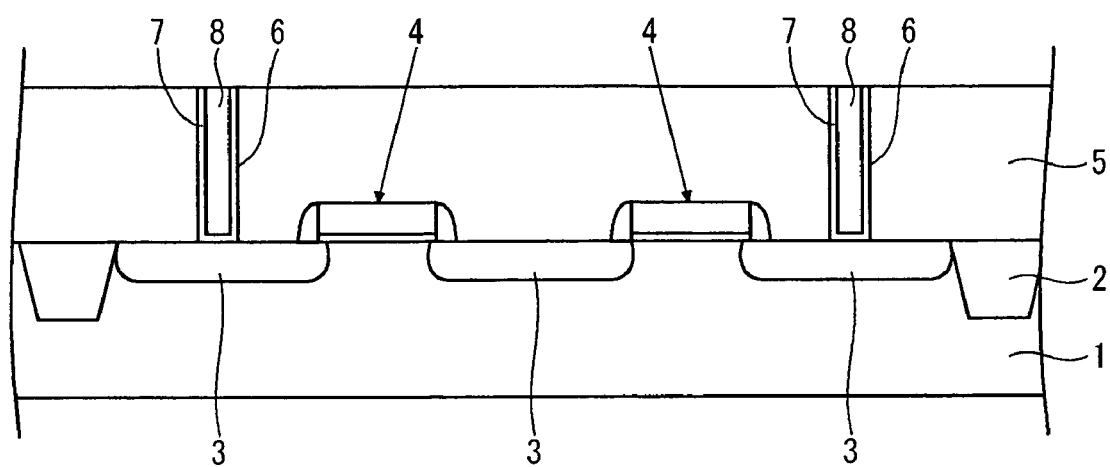
FIGS. 1A to 2C are cross-sectional views showing manufacturing processes of a semiconductor device according to a first preferred embodiment of the present invention.

Selected embodiment of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Now, a semiconductor device including a ferroelectric capacitor according to a first preferred embodiment of the present invention will be described referring to the drawings. FIGS. 1A to 2C are cross-sectional views showing manufacturing processes of a semiconductor device 20 according to this embodiment.

Forming Laminated Structure Film and Etching Mask

As shown in FIG. 1A, first, using a common silicon semiconductor process, field oxides 2 and diffusion layers 3 are formed in a semiconductor substrate 1 that is preferably a silicon semiconductor substrate, and transistors (i.e. the circuit elements formed on the semiconductor substrate 1) 4 having respectively a gate oxide and a gate electrode are further formed on the semiconductor substrate 1. Then, an insulation film (first insulation film) 5 is formed on the semiconductor substrate 1 so that the transistors 4 are covered. Then, the surface of the insulation film 5 is planarized.

Next, by etching the insulation film 5, apertures 6 are formed over the diffusion layers 3 so that the parts of the diffusion layers 3 are exposed. Then, barrier films 7 are formed inside the apertures 6 so that side walls of the apertures 6 and the exposed surfaces of the diffusion layers 3 are covered. Plug electrodes 8 are then formed on the barrier films 7 in such a way so that the inside of the apertures 6 are filled. For example, the material of the barrier film 7 includes titanium nitride (TiN), and the material of the plug electrode 8 includes tungsten (W).

Figure 1B:
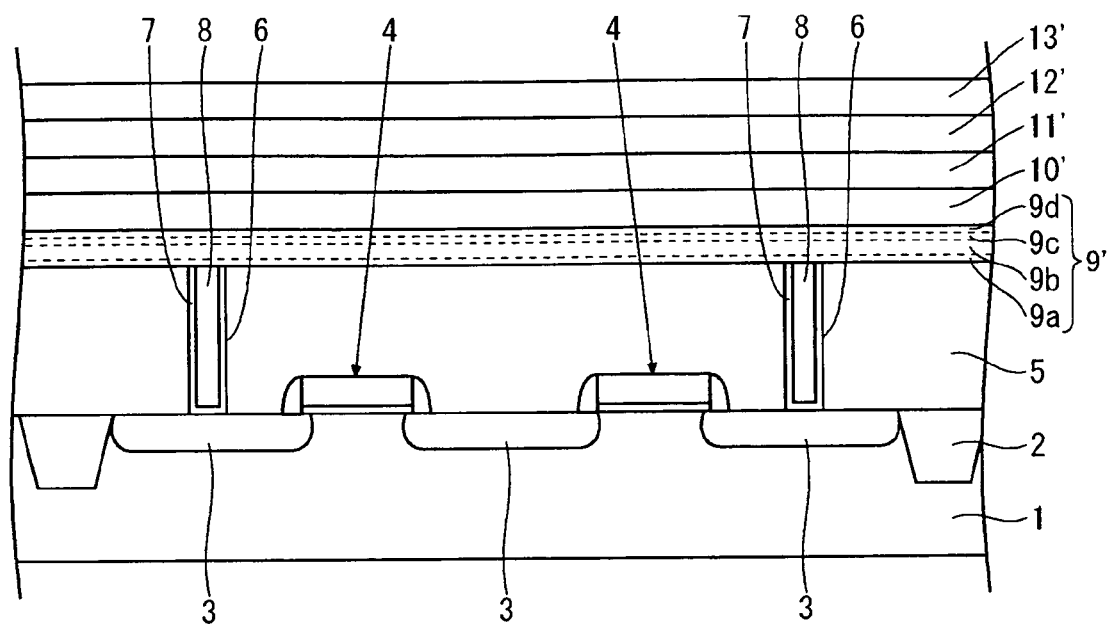

Next, as shown in FIG. 1B, a titanium aluminum nitride (TiAlN) film 9a is formed over the surface of the semiconductor substrate 1 as an oxidation inhibitor of the plug electrodes 8 by sputtering. Continuously, an iridium (Ir) film 9b and an iridium oxide (IrO$_2$) film 9c are sequentially formed on the TiAlN film 9a as an adhesion layer of the TiAlN film 9a by sputtering, as well. The TiAlN film 9a, the Ir film 9b, and the IrO$_2$ film 9c construct a structure of a lower electrode (first electrode) 9. After forming the IrO$_2$ film 9c, a Pt film 9d is formed on the IrO$_2$ film 9c by sputtering. The TiAlN film 9a, the Ir film 9b, the IrO$_2$ film 9c, and the Pt film 9d construct a multilayer film 9'. This multilayer film 9' is processed into lower electrodes 9 of ferroelectric capacitors 19, shown in FIG. 1C, in the following process.

Here, as for the conditions of sputtering TiAlN, for instance, the sputtering target is set to TiN (with a composition ratio of 1:1), the environment inside the chamber is set to Ar/N$_2$, the DC power is set to 1000 W (watt), the substrate temperature is set to 200° C., and the film thickness of the TiAlN film 9a is set to 50 nm (nanometer). As for the sputtering conditions for Ir, for instance, the sputtering target is set to Ir, the environment inside the chamber is set to Ar, the DC power is set to 1000 W, the substrate temperature is set to 400° C., and the film thickness of the Ir film 9b is set to 400 nm. As for the sputtering conditions for IrO$_2$, for instance, the sputtering target is set to Ir, the environment inside the chamber is set to Ar/O$_2$, the DC power is set to 500 W, the substrate temperature is set to 350° C., and the film thickness of the IrO$_2$ is set to 100 nm. As for the sputtering conditions for Pt, for instance, the sputtering target is set to Pt, the environment inside the chamber is set to Ar, the DC power is set to 1000 W, and the film thickness of the Pt film 9d is set to 50 nm.

Next, as shown in FIG. 1B, an SBT (tantalic acid strontium bismuth: $SrBi_2Ta_2O_9$) film 10' is formed on the Pt film 9d by a sol-gel process. This SBT film 10' is processed into ferroelectric films 10 of the ferroelectric capacitors 19 in the following process. The SBT film 10' is formed in three-time coating. In particular, first, a precursor solution in which SBT is dissolved is spin-coated on the Pt film 9d, and hardened by annealing at 700° C. Second, a precursor solution is spin-coated on the hardened precursor solution, and hardened by annealing at 700° C. Finally, a precursor solution is spin-coated on the product layer of hardened precursor solution, and hardened by annealing at 800° C. Accordingly, the SBT film 10' having a three-layer structure is formed on the multilayer film 9'. The thickness of the SBT film 10' is, for example, 100 nm.

Next, a Pt film 11' is formed on the SBT film 10' by sputtering. This Pt film 11' is processed into upper electrodes (second electrode) 11 of the ferroelectric capacitors 19. The conditions of sputtering Pt for forming the Pt film 11' are the same as or similar to the conditions of sputtering Pt for forming the Pt film 9d.

The multilayer film 9', the SBT film 10', and the Pt film 11' constitute a laminated structure film of the ferroelectric capacitor 19.

Then, a TiN film 12' is formed on the Pt film 11' by sputtering, and a silicon oxide ($SiO_2$) film 13' is formed on the TiN film 12' by a plasma CVD (chemical vapor deposition) method. The TiN film 12' is processed into a first etching mask 12 shown in FIG. 1C, and the $SiO_2$ film 13' is processed into a second etching film 13, also shown in FIG. 1C, according to the following processes, respectively. The first etching mask 12 and the second etching mask 13 construct a two-layer etching mask film. Hereafter, the first etching mask 12 and the second etching mask 13 will be respectively referred to simply as a first mask 12 and a second mask 13 for brevity.

As for the sputtering conditions for TiN, for instance, the sputtering target is set to Ti, the environment inside the chamber is set to $N_2$, the DC power is set to 5000 W, the substrate temperature is set to 100° C., and the film thickness of the TiN film 12' is set to 100 nm. The $SiO_2$ film 13', for instance, is formed to be 100 nm thick by a P-TEOS (plasma-tetraethoxysilane) CVD method.

Figure 2A:
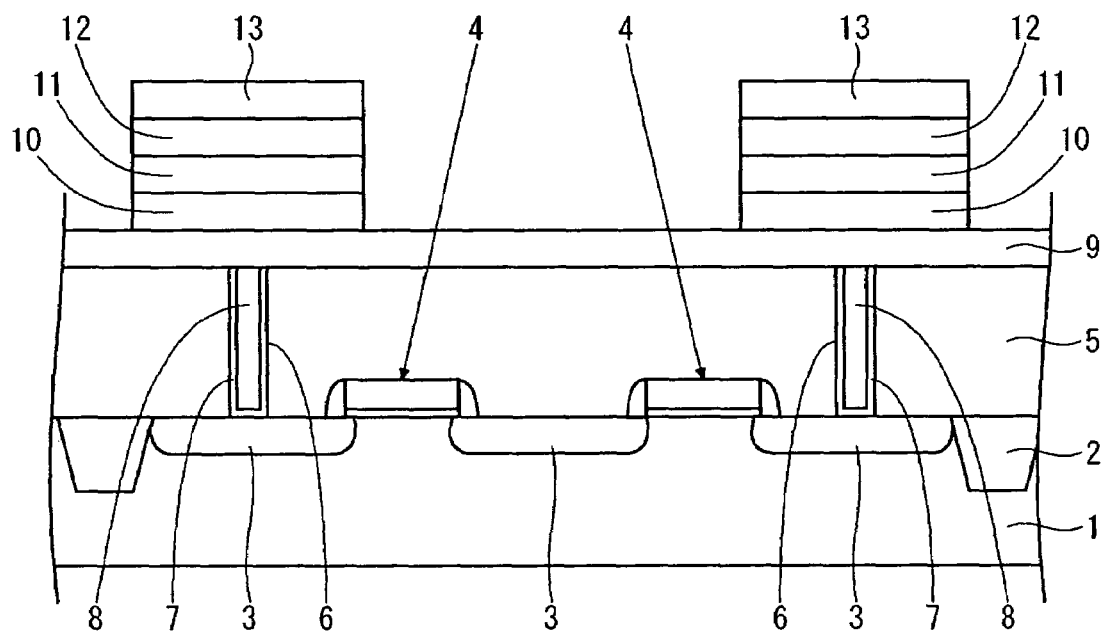
Figure 2B:
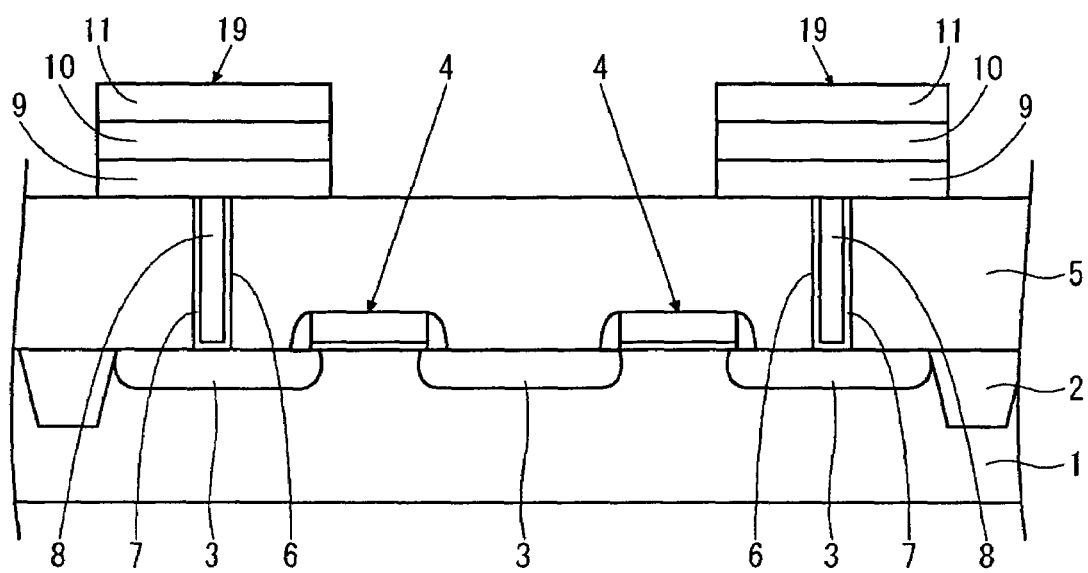

The $SiO_2$ film 13' that will be processed into the second mask 13 is formed with a film thickness such that the second mask 13 will remain until after an etching process of the SBT film 10' shown in FIG. 2A is finished, and be removed in the middle of an etching process of the multilayer film 9' shown in FIG. 2B. On the other hand, the TiN film 12' that will be processed into the first mask 12 is formed with the film thickness such that the first mask 12 will be removed in the over-etching of the etching process of the multilayer film 9' shown in FIG. 2B. In this manner, by setting the film thicknesses of the first etching mask 12 and the second etching mask 13 so that the first etching mask 12 and the second etching mask 13 are removed by the end of the etching process of the multilayer film 9' shown in FIG. 2B, etching processes for the etching masks (the first mask 12 and/or the second mask 13) can be omitted. In addition, if the film thickness of the etching mask constructed from the first etching mask 12 and the second etching mask 13 is set so that the etching mask will remain after the etching process of the multilayer film 9' shown in FIG. 2B, the etching of the etching mask should be conducted after the etching process of the multilayer film 9'.

Figure 1C:
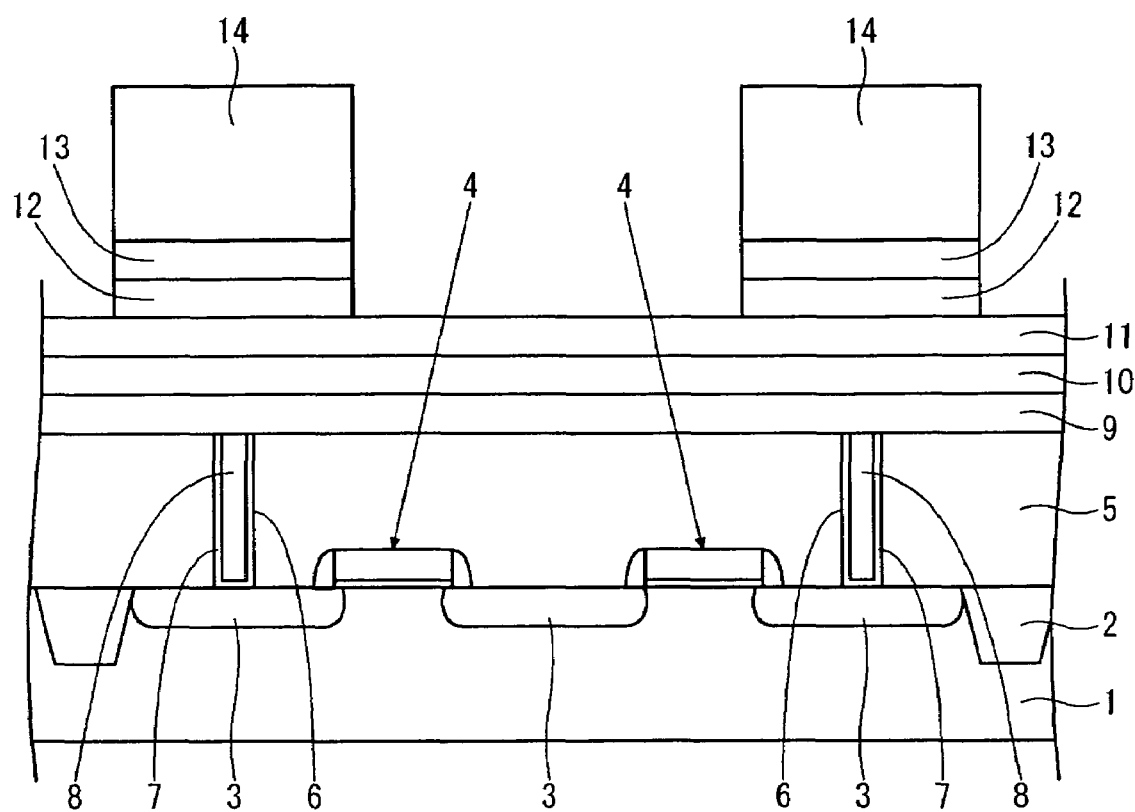

Next, a resist 14 is formed on the second mask 13, and as shown in FIG. 1C, capacitor patterns (predetermined pattern) are transcribed to the resist 14 using a common photolithography method. Then, the $SiO_2$ film 13' and the TiN film 12' are etched using the resist 14 so that the etching mask constructed from the $SiO_2$ film 13' and the TiN film 12' has the mask pattern. A method used in a known CMOS (Complimentary Metal Oxide Semiconductor) process can be applied to the etching of the $SiO_2$ film 13' and the TiN film 12'. In this case, a mixed gas including $C_4F_8$, Ar, and $O_2$ is used for the etching of the $SiO_2$ film 13', and a mixed gas including $BCl_3$ and $Cl_2$ is used for the etching of the TiN film 12'.

Subsequently, a common plasma ashing process with $O_2$ and a cleaning process with $H_2SO_4$ are carried out in removing the resist 14. In addition, although the cleaning process with $H_2SO_4$ is used here, it is also possible to use a cleaning process with an organic remover to remove the resist 14.

Etching of Upper Electrode

Figure 1D:
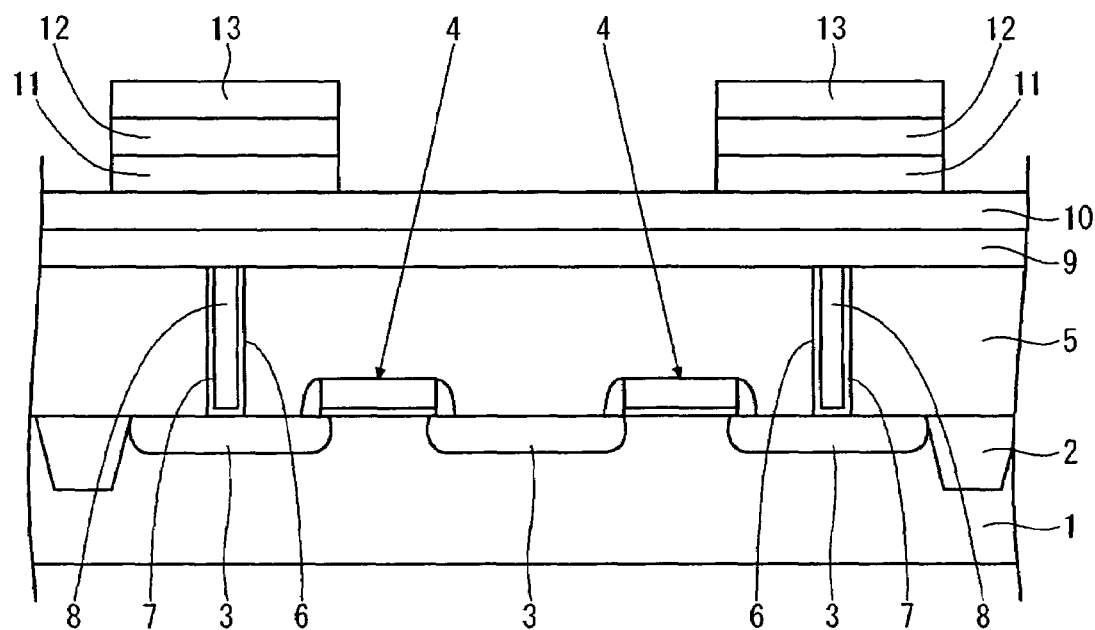

Next, as shown in FIG. 1D, the Pt film 11' is etched using the second mask 13 (i.e. $SiO_2$ film) as a mask in order to form the upper electrodes 11. This process is conducted in a chamber 102 with an etching apparatus 100 shown in FIG. 3.

Figure 3:
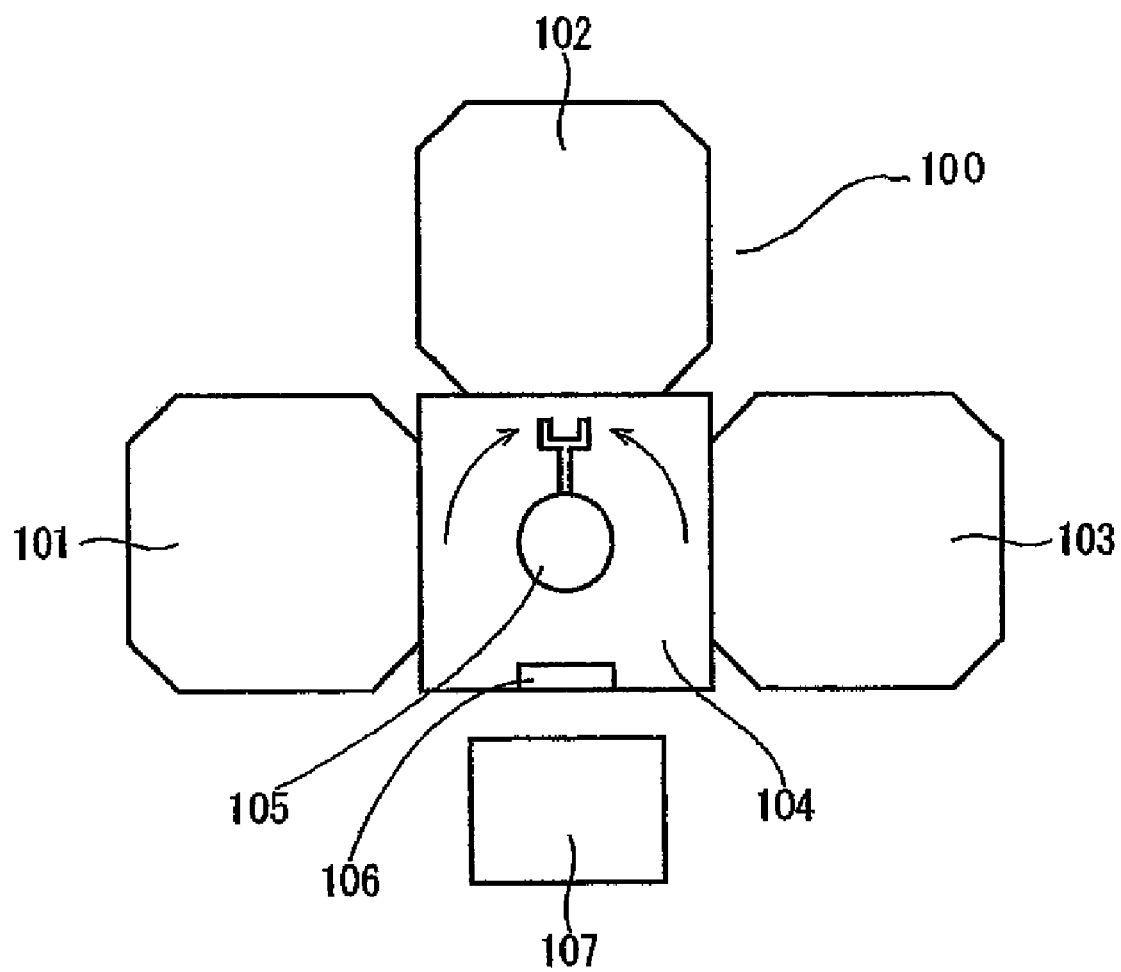
FIG. 3 is a schematic view of an etching apparatus used in the manufacturing processes of the present invention.

FIG. 3 is a schematic view of the etching apparatus 100 used in this embodiment. The etching apparatus 100 shown in FIG. 3 is a parallel-plate-type RIE (reactive ion etching) apparatus. This etching apparatus 100 has a chamber 101, a chamber 102, a chamber 103, a carrier room 104, and a carrying machine 105. The carrying machine 105 is arranged in at the carrier room 104.

The chamber 101 has a lower mounting electrode (first mounting electrode) having a semiconductor wafer (hereinafter referred to as a wafer) mounted thereon. The chamber 101 is capable of controlling the temperature of the lower mounting electrode to be within the range of 25 to 350° C. The chamber 102 has a lower mounting electrode (second mounting electrode) having a wafer mounted thereon. The chamber 102 is capable of controlling the temperature of the lower mounting electrode to be within the range of 350 to 450° C. The chamber 103 is a chamber for ashing.

The etching apparatus 100 includes structures that respectively apply high-frequency powers of 13.56 MHz and 450 KHz to the lower mounting electrodes of the chambers 101 and 102. The carrier room 104 has an entrance 106, and the carrying machine 105 takes the wafer in and out through the entrance 106. A cassette 107 is arranged outside the entrance 106. The carrying machine 105 receives the wafer from the cassette 107 and brings it in the carrier room 104 through the entrance 106. Furthermore, the carrying machine 105 removes the wafer from the carrier room 104 through the entrance 106, and stores the wafer inside the cassette 107.

In order to etch the Pt film 11' as fast as possible, it is important to bring the temperature of the wafer to the temperature (first/third temperature) where platinum chloride autonomously or independently evaporates in a $Cl_2$ plasma. Taking this into account, as mentioned above, the chamber 102 for etching the Pt film 11' has a structure that is capable of maintaining the temperature of the lower mounting electrode to be within the range of 340 to 450° C. With this structure, it is possible to bring up the temperature of the wafer mounted on the lower mounting electrode to be within the range of 350 to 450° C., and to make the platinum chloride autonomously or independently evaporate in the $Cl_2$ plasma. Accordingly, the Pt film 11' can be etched in high-speed.

Moreover, by bringing up the temperature of the wafer mounted on the lower mounting electrode to be within the range of 350 to 450° C., the platinum chloride becomes more evaporable. Accordingly, reattachment of a removed material such as the platinum chloride to the ferroelectric film 10 can be prevented.

As for the conditions of etching the Pt film 11' into the upper electrode 11, the following processing conditions were mainly used. The processing conditions are, a mixed gas including $Cl_2$ and $O_2$ or a mixed gas including $Cl_2$, $O_2$, and Ar is used for the etching gas. Furthermore, when the mixed gas including $Cl_2$ and $O_2$ is used, the gas flow is set to $Cl_2/O_2$=5/15 sccm (standard cc/min). On the other hand, when the mixed gas including $Cl_2$, $O_2$, and Ar is used, the gas flow is set to $Cl_2/O_2/Ar$=5/15/10 sccm. In both cases, the gas pressure should be set to 2 mTorr, the RF power of 13.56 MHz should be set to 1000 W, and RF power of 450 KHz should be set to 100 W. Furthermore, the temperature of the lower mounting electrode in the chamber 102 and the wafer are set to be within the range of 350 to 450° C., and the temperature of the inner wall of the chamber 102 is set to 80° C.

In these conditions, the etching rate of Pt is 60 nm/min, the etching rate of SBT is 20 nm/min, and the selection ratio of Pt as opposed to SBT is more than 3. As for the etching gas for etching the Pt film 11' into the upper electrode 11, instead of using the mixed gas including $Cl_2$ and $O_2$ or the mixed gas including $Cl_2$, $O_2$, and Ar, it is also possible to use a mixed gas including $Cl_2$ and Ar.

Figure 4A:
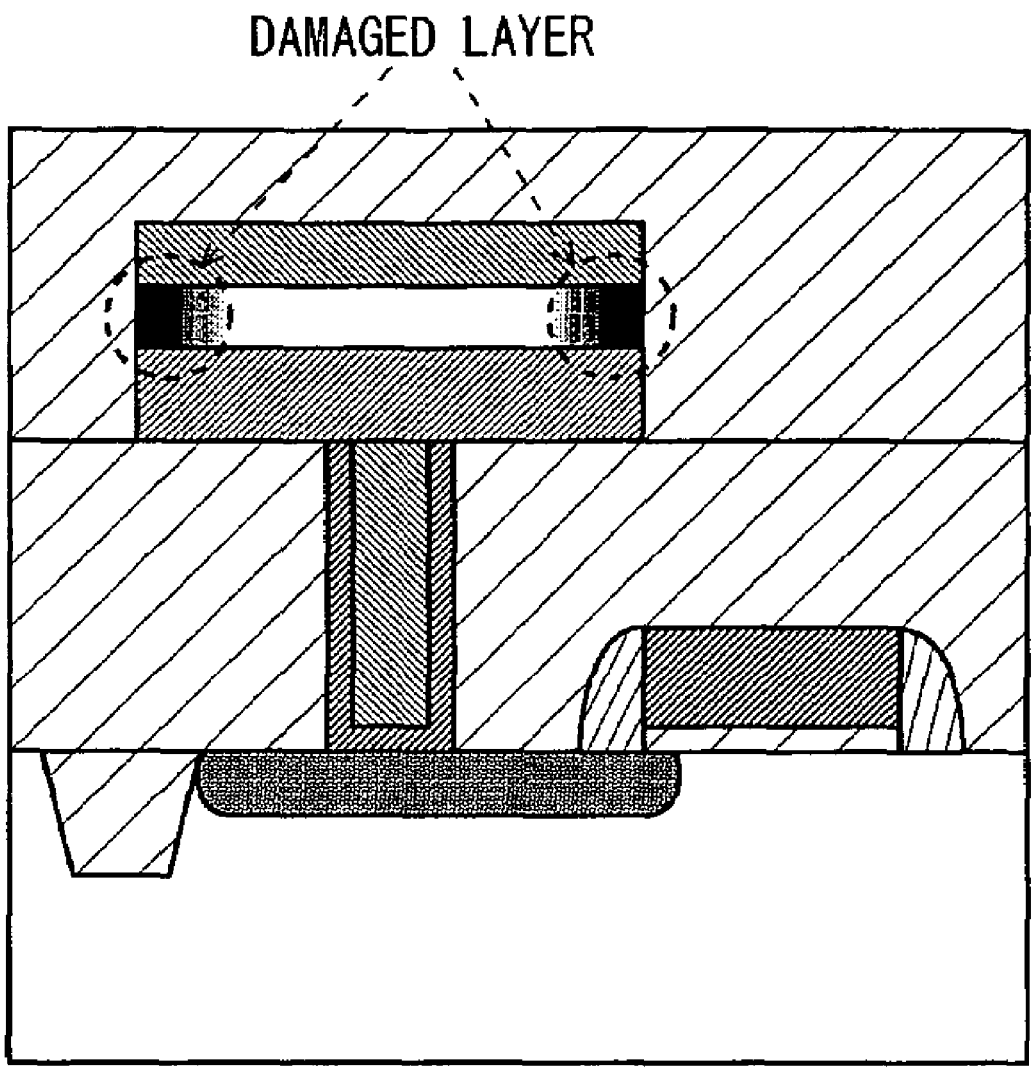
FIG. 4A is a cross-sectional view illustrating a damaged layer in a small-size capacitor.
Figure 4B:
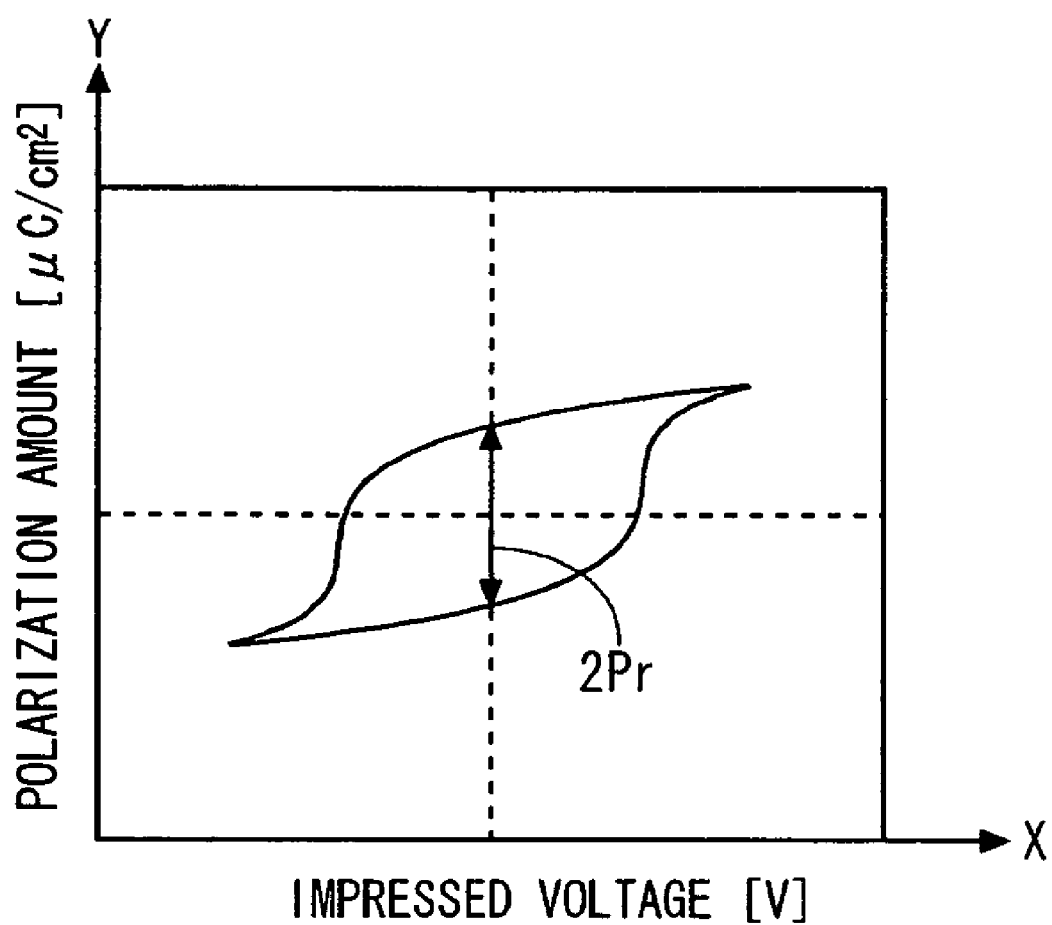
FIG. 4B is a view of a graph showing a hysteresis characteristic of the small-size capacitor.
Figure 4C:
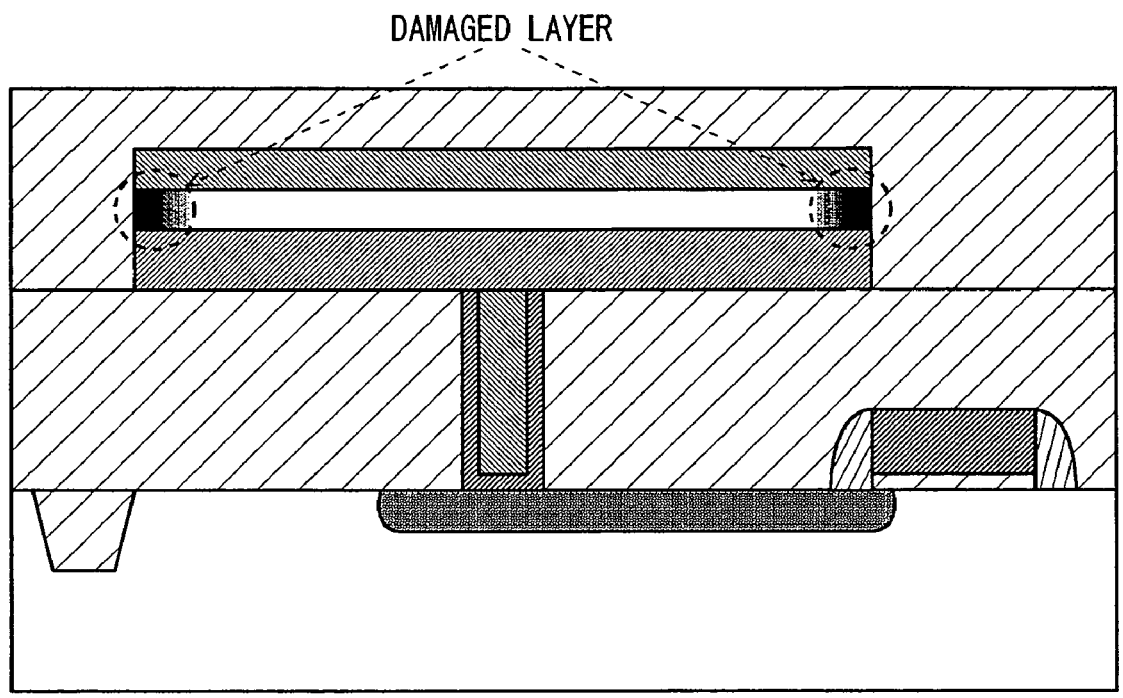
FIG. 4C is a cross-sectional view illustrating a damaged layer in a large-size capacitor.

As for the optimization of the gas process, evaluations on the remanence polarization amount of the formed capacitors are used. As for the values of the remanence polarization amount, width values 2Pr of the range between two intersection points of hysteresis curves and y-axis in the hysteresis characteristics (shown in FIGS. 4B and 4D) of capacitors as shown in FIGS. 4A and 4C are used. The unit of the width value (i.e. remanence polarization amount) is $\mu C/cm^2$.

In FIG. 5A, the values of the remanence polarization amount in the case in which the mixed gas including $Cl_2$ and $O_2$ is used, and the case in which the mixed gas including $Cl_2$, $O_2$, and Ar is used are shown.

As shown in FIG. 5A, with respect to any the cases for which the area of the upper electrode 11 is 625 µm, 64 µm, and 16 µm, respectively, the values of the remanence polarization amount in the case in which the mixed gas including $Cl_2$ and $O_2$ is used are approximately the same as the values of the remanence polarization amount in the case in which the mixed gas including $Cl_2$, $O_2$, and Ar is used, respectively.

Etching of Ferroelectric Film

After the upper electrode 11 is formed by etching the Pt film 11', the wafer is removed from the etching apparatus 100, and stored in the cassette 107. Then, the wafer is brought back in the carrier room 104, and thrown into the chamber 101 (shown in FIG. 3). In the chamber 101, as shown in FIG. 2A, the SBT film 10', which is processed into ferroelectric films 10, is etched using the second mask 13 as a mask.

Here, the reason for removing the wafer from the etching apparatus 100 after the upper electrode 11 is formed is that the etching apparatus 100 of the present embodiment has a structure such that the wafer can be carried from the chamber 101 to the chamber 102 in the apparatus as illustrated by arrows in FIG. 3, and in this structure, although it is possible to carry the wafer from the chamber 101 to the chamber 102, carrying the wafer from the chamber 102 to chamber 101 is not possible. In addition, with the etching apparatus 100 whose structure allows conveyance of the wafer to the chamber 101 from the chamber 102, it is not necessary to remove once the wafer outside.

The chamber 101 for etching the SBT film 10' that is processed into ferroelectric films 10, as mentioned above, has a structure that is capable of maintaining the temperatures of the lower mounting electrode and an inner wall of the chamber to be within the range of 25 to 350° C., and controlling their temperatures within this range (second temperature).

As for the etching gas for etching the SBT film 10' that is processed into ferroelectric films 10, for example, a mixed gas including $Cl_2$ and Ar can be used. The main conditions of etching the SBT film 10' are, for example, set to $Cl_2/Ar$=10/10 sccm for a gas flow rate, 1 mTorr for a gas pressure, 550 W for the RF power of 13.56 MHz, and 120 W for the RF power of 450 KHz. As for the etching gas for etching the SBT film 10', instead of using the mixed gas including $Cl_2$ and Ar, it is also possible to use gaseous chlorine, a mixed gas including $Cl_2$ and $O_2$, or a mixed gas including $Cl_2$, $O_2$, and Ar.

Etching of Lower Electrode

After the ferroelectric film 10 is formed by etching the SBT film 10', the wafer is carried to the chamber 102 from the chamber 101, and the Pt film 9d, the $IrO_2$ film 9c, the Ir film 9b and the TiAlN film 9a, i.e. the multilayer film 9', are etched in the chamber 102 as shown in FIG. 2B. Accordingly, the ferroelectric capacitor 19 is formed.

The chamber 102 for etching the multilayer film 9', as mentioned above, has a structure that is capable of maintaining the temperature of the lower mounting electrode to be within the range of 350 to 450° C., and controlling the temperature within this range.

As for the etching gas for etching the multilayer film 9', for example, a mixed gas including $Cl_2$ and $O_2$ or a mixed gas including $Cl_2$, $O_2$, and Ar can be used. The main conditions for etching the multilayer film 9' are, for example, set to $Cl_2/O_2$=5/15 sccm or $Cl_2/O_2/Ar$=5/15/10 sccm for a gas flow rate, 1 or 2 mTorr for a gas pressure, 1000 W for the RF power of 13.56 MHz, and 100 W for the RF power of 450 KHz. Furthermore, the temperature of the lower mounting electrode in the chamber 102 is set to be within the range of 350 to 450° C., and the temperature of the inner wall of the chamber is set to 80° C.

In these conditions, the etching rate of Pt is 60 nm/min, the etching rate of SBT is 20 nm/min, and the selection ratio of Pt as opposed to SBT is more than 3. As for the etching gas for etching the multilayer film 9', instead of using the mixed gas including $Cl_2$ and $O_2$ or a mixed gas including $Cl_2$, $O_2$, and Ar, it is also possible to use a mixed gas including $Cl_2$ and Ar.

As for the optimization of the gas process, evaluations on the remanence polarization amount of a formed capacitors are used. As for the values of the remanence polarization amount, width values 2Pr of the range between two intersection points of hysterisis curves and y-axis in the hysteresis characteristics (shown in FIGS. 4B and 4D) of capacitors as shown in FIGS. 4A and 4C are used. The unit of the width value (i.e. remanence polarization amount) is $\mu C/cm^2$.

In FIG. 5B, the values of the remanence polarization amount in the case in which the mixed gas including $Cl_2$ and $O_2$ is used, and the case in which the mixed gas including $Cl_2$, $O_2$, and Ar is used are shown.

As shown in FIG. 5B, with respect to any the cases for which the area of the upper electrode 11 is 625 µm, 64 µm, and 16 µm, the values of the remanence polarization amount in the case for which the mixed gas including $Cl_2$ and $O_2$ is used are approximately the same as the values of the remanence polarization amount in the case for which the mixed gas including $Cl_2$, $O_2$ and Ar is used, respectively.

After Etching of Laminated Structure Film Constructed from Upper Electrode,

Ferroelectric Film and Lower Electrode

Figure 2C:
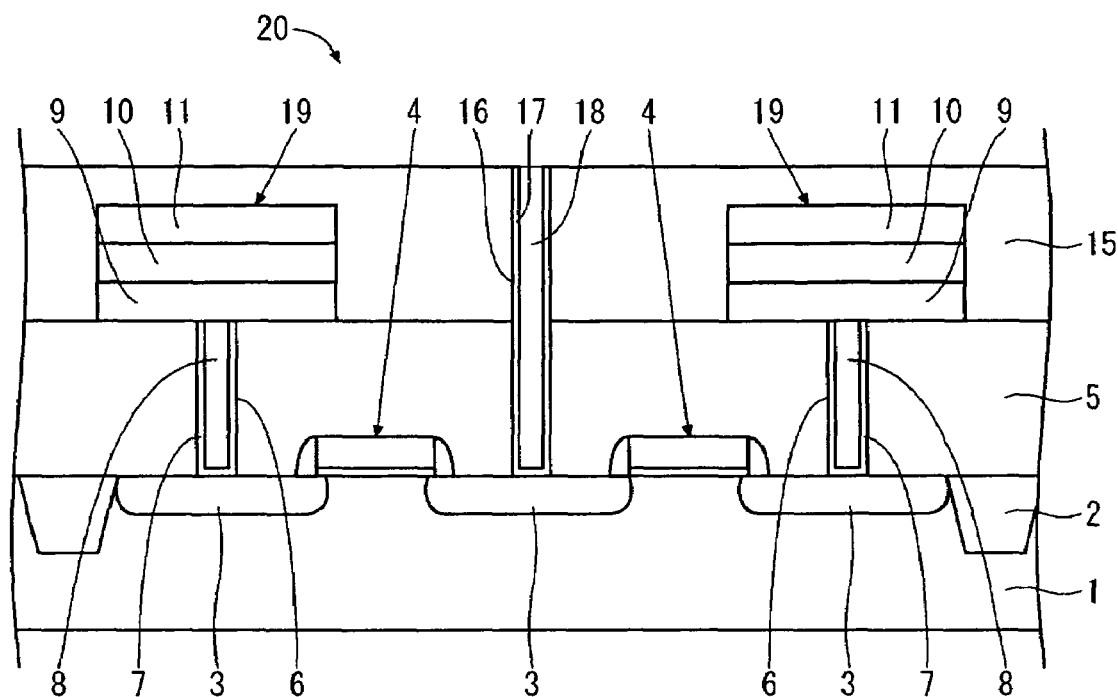

Moreover, as shown in FIG. 2C, an insulation film 15, which is a CVD insulation film, is formed over the semiconductor substrate 1 so that the insulation film 5 and the ferroelectric capacitor 19 are covered. Then the surface of the insulation film 15 is planarized by etch-backing and a CMP (Chemical and Mechanical Polishing) method, or the like. After that, as shown FIG. 2C, in order to connect the ferroelectric capacitor 19 and the transistors 4, an aperture 16 is formed over the diffusion layer 3 so that the diffusion layer 3 is exposed, by patterning the insulation film 15 and the insulation film 5, while the insulation film 15 except for the parts corresponding to memory cell-blocks, which are constructed from the ferroelectric capacitors 19 and a peripheral part thereof, is removed. Then, a barrier film 17 is formed inside the aperture 16 so that the side wall of the aperture 16 and the exposed surface of the diffusion layer 3 are covered. Then a plug electrode 18 is formed on the barrier film 17 such that the aperture 16 is filled.

Since the interval between the aperture 16 and the ferroelectric capacitor 19 can be sufficiently maintained, the damage that may be caused by the process of forming the aperture 16 and by processing the barrier film 17 and the plug electrode 18 barely pose any problem.

Capacitor Characteristic

Damaged Layer

The characteristic of the ferroelectric capacitor 19 will now be described. When the ferroelectric film is exposed in the process of etching for forming the upper electrode 11, the ferroelectric film 10 and the lower electrode 9, a reduction reaction due to a gaseous chlorine or the like contained in the environment of the dry-etching process will occur, which weakens the dielectric polarization which is a characteristic of a ferroelectric capacitor. A part having such weak dielectric polarization is called a damaged layer.

Figure 4D:
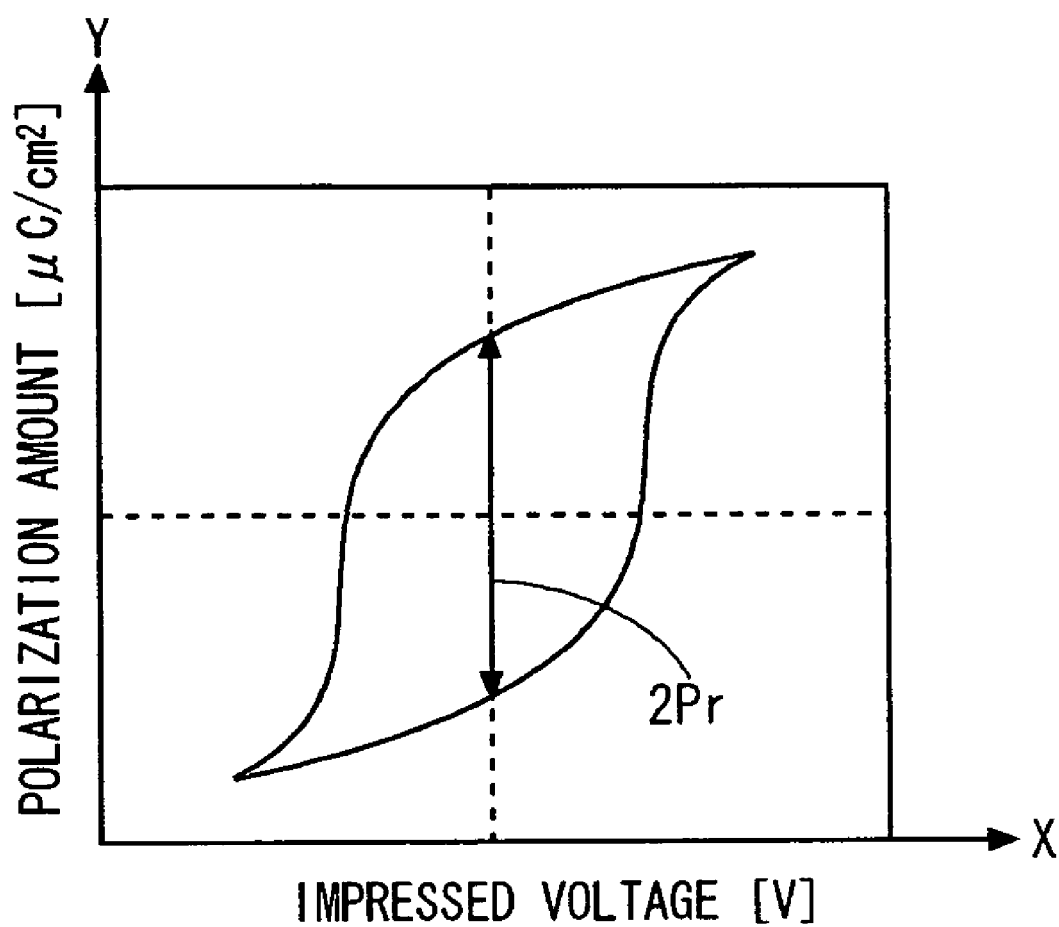
FIG. 4D is a view of a graph showing a hysteresis characteristic of the large-size capacitor.

As shown in FIGS. 4A and 4C, the damaged layer is formed in the perimeter part of the ferroelectric film 10 such that it extends inside from the side of the ferroelectric film 10. This damaged layer is formed approximately in the same size with respect to a case in which the area of the ferroelectric capacitor is small (as shown in FIG. 4A) or the case where the area of the ferroelectric capacitor is large (as shown in FIG. 4C). For this sake, the smaller the ferroelectric capacitor is, the larger the rate of the area occupied with the damaged layer becomes larger with respect to the effective area of the ferroelectric capacitor. As shown in FIGS. 4B and 4D, compared with the case in which the effective area of the ferroelectric capacitor is large, the remanence polarization amount is small in the case in which the effective area of the ferroelectric capacitor is small.

In the manufacturing method as mentioned above, bringing up the temperature of the wafer to be within the range of 350 to 450° C. in the process of forming the upper electrode 11 and the lower electrode 9 by etching, the etching rate of the upper electrode 11 and the lower electrode 12 can be increased. Therefore, the time during which the ferroelectric film 10 is exposed to the environment of the dry-etching process can be shorten, and the damaged layer in the ferroelectric film 10 can be decreased.

Leak Current

Next, influences of the etching temperature of the ferroelectric film over the leak current of the ferroelectric capacitor will be explained. First, an experiment on how the leak current of the ferroelectric capacitor can be controlling by controlling the temperature of the ferroelectric film in the etching process, and the results thereof will be explained.

In this experiment, an SBT film is used as the ferroelectric film. Furthermore, in order to change the temperature of the ferroelectric film in the etching process, a first chamber that can control the temperature of the lower mounting electrode to be within the range of 350 to 450° C. and a second chamber that can control the temperature of the lower mounting electrode to be within the range of 25 to 350° C. are used for etching the ferroelectric film. Moreover, as for the conditions of etching the ferroelectric film, a mixed gas including $Cl_2$, Ar, and $O_2$ is used for a etching gas, the gas flow is set to $Cl_2/Ar/O_2=10/10/10$ sccm, the gas pressure is set to 1 mTorr, the RF power of 13.56 MHz is set to 550 W, and the RF power of 450 KHz is set to 120 W. For the evaluation, a ferroelectric capacitor of which capacitor area is 1.4 $\mu m^2$ is used.

FIG. 5C shows the evaluation on the remanence polarization amount and the leak current of the ferroelectric capacitor depending on the conditions of etching of the ferroelectric film (i.e. SBT film). In this evaluation, the temperature of the lower mounting electrode of the etching apparatus was set to 80° C., 350° C., and 450° C. in the etching process of the ferroelectric film. The leak current is a current value in the case where 3 V was impressed between the upper electrode 11 and the lower electrode 9.

Referring to FIG. 5C, even if the temperature of the ferroelectric film changes, the remanence polarization amount of the ferroelectric capacitor hardly changes. On the other hand, the leak current in the case where the temperature of the ferroelectric capacitor in the etching process is 80° C. is approximately the same as the leak current in the case where the temperature of the ferroelectric capacitor in the etching process is 350° C. However, if the temperature of the ferroelectric capacitor is brought up to 450° C., the leak current increases.

In the case in which the temperature of the ferroelectric current in the etching process is 450° C., the damaged layer in the etching process of the ferroelectric film may not cause deterioration that affects the remanence polarization amount, but increase the leak current. On the other hand, in the case where the temperature of the ferroelectric film in the etching process is 350° C. or less, the increase of leak current is controlled, and the leak current may even be reduced.

In this embodiment mentioned above, the leak current is reduced by setting the temperature of the wafer in the etching process of the ferroelectric film from 80 to 100° C.

Elevation Angle of Side of Pattern

Generally, in etching of the Pt film into the lower electrode, if the elevation angle θ of the side of the ferroelectric film is close to a right angle (i.e. 90°), reattachment of a removed material, which is removed from the Pt film as platinum chloride, may occur, and this may cause a short circuit between the upper electrode and the lower electrode.

Figure 6A:
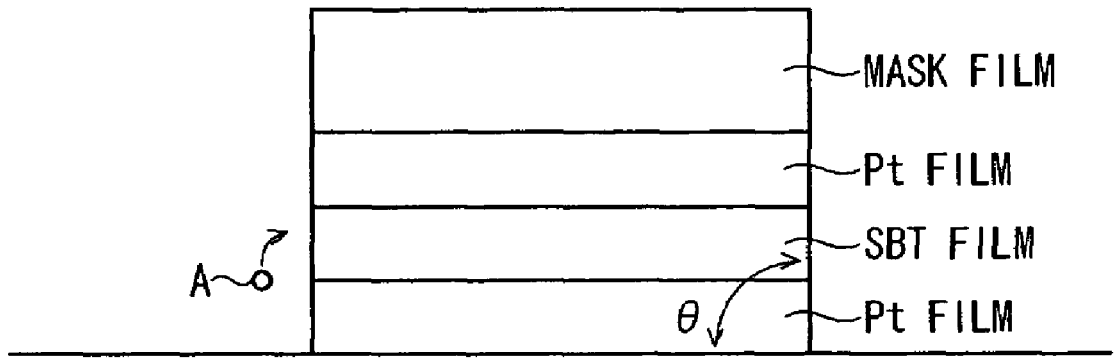
FIGS. 6A to 6C are cross-sectional views of a laminated structure film (i.e. ferroelectric capacitor) for explaining an elevation angle θ of the side of the laminated structure film with respect to the bottom thereof.
Figure 6B:
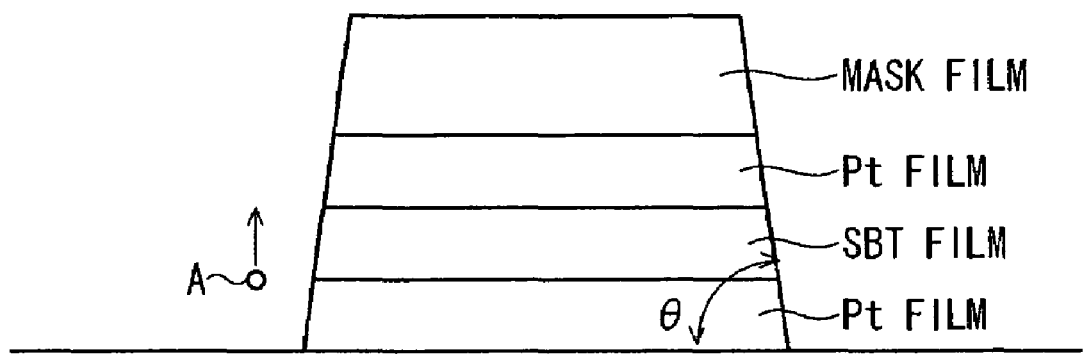
Figure 6C:
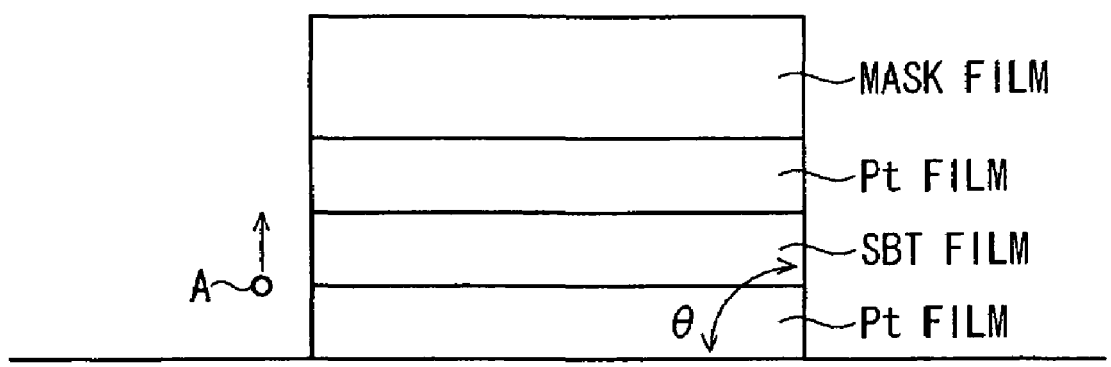

Here, θ in FIGS. 6A to 6C is the elevation angle of the side of the laminated structure film with respect to the bottom of the first electrode. In other words, the elevation angle θ is an inner angle that the side and the bottom of the laminated structure film constitute. The laminated structure film is constructed from the upper electrode, the ferroelectric film, and the lower electrode. In addition, in FIGS. 6A to 6C, signs of removed material A are shown by arrows.

Conventionally, in order to prevent possible reattachment of removed material A in the etching process, as shown in FIG. 6B, the elevation angle θ of the laminated structure film is set to be lower than 75° which is lower than 90°. Thereby, it has been attempted to prevent possible reattachment of removed material A. However, as the elevation angle becomes smaller, it is necessary to increase the area of the ferroelectric capacitor in order to acquire the same characteristic. For this sake, miniaturization of the ferroelectric capacitor has been difficult.

As opposed to the conventional cases, in this embodiment, it is possible to bring up the temperature of the upper electrode 11, the ferroelectric film 10, and the lower electrode 9 to be within the range of 350 to 450° C., and to make the platinum chloride autonomously evaporate. Therefore, possible reattachment of removed material A (i.e. platinum chloride or the like) hardly occurs, and the elevation angle θ can be set as 80° or more as shown in FIG. 6C. Accordingly, the forming area of the ferroelectric capacitor can be reduced drastically.

Operation Effect

According to this embodiment, since the temperature of the wafer or the lower mounting electrode that has the wafer mounted thereon is set to be within the range of 350 to 450° in the etching process for collectively etching the ferroelectric capacitor with the laminated structure, the upper electrode and the lower electrode can be processed by etching in high-speed.

Furthermore, in this embodiment, the upper electrode and the lower electrode are processed by etching under the condition that the temperature of the wafer or the lower mounting electrode that has the wafer mounted thereon is set to be with in the range of 350 to 450° C. Thereby, the evaporability of materials of the upper electrode and the lower electrode is improved in the etching process, and the elevation angle θ of the side of the laminated structure film can be made close to the right angle (i.e. 90°). Accordingly, the forming area of the ferroelectric capacitor can be drastically reduced, and the ferroelectric capacitor can be downsized.

Furthermore, in this embodiment, the ferroelectric film is processed by etching under the condition that the temperature of the wafer or the lower mounting electrode that mounts the wafer is set to be with in the range of 25 to 350° C. Thereby, possible deterioration that may be a cause of producing a path of the leak current toward the ferroelectric film can be prevented, and the leak current that may be caused by the deterioration of the ferroelectric film can be controlled.

Moreover, according to this embodiment, the upper electrode, the ferroelectric film, and the lower electrode are processed by etching under the conditions that the temperature of the upper electrode, the ferroelectric film, and the lower electrode is set as mentioned above, and mixed gas including gaseous chlorine and at least one of gaseous oxygen and gaseous argon is set as the etching gas. Thereby, the ferroelectric capacitor with the laminated structure can be processed by etching in the block while the deterioration in the characteristic of the ferroelectric film can be controlled.

Other Embodiments

In the embodiment of the present invention mentioned above, the ferroelectric film is made of SBT (i.e. an SBT system compound). However, as for the material of the ferroelectric film, instead of using SBT, it is also possible to use PZT (lead titanate-lead zirconate:$PbTiO_3$—$PbZrO_3$) (i.e. a PZT system compound) and so on.

Furthermore, in the embodiment of the present invention mentioned above, the ferroelectric film is made of SBT, and the sol-gel process is used for the process of forming the SBT film. However, the process of forming the SBT film is not limited to the sol-gel process. It is also possible to use the other forming processes such as a CVD method or the like.

Furthermore, in the embodiment of the present invention as mentioned above, the TiAlN film are formed as the oxidation inhibitor of the plug electrodes 8, the Ir film and the $IrO_2$ film is formed as the adhesion layer, and the lower electrode 9 with the laminated structure including the Pt film is formed as a main electrode. However, the oxidation inhibitor of the plug electrodes 8 is not limited to the TiAlN film. It is also possible to use other materials for the oxidation inhibitor.

Moreover, this invention can also be applied when the upper electrode 11 and the lower electrode 9 are formed in either an island shape or a stripe shape.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

As used herein, the following directional terms "forward, rearward, above, downward, vertical, horizontal, below and transverse" as well as any other similar directional terms refer to those directions of a device equipped with the present invention. Accordingly, these terms, as utilized to describe the present invention should be interpreted relative to a device equipped with the present invention.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

What is claimed is:

1. A method of manufacturing a semiconductor device comprising:

forming a circuit element on a semiconductor substrate;

forming a first insulation film on said semiconductor substrate, said first insulation film covering said circuit element;

forming a first electrode on said first insulation film;

forming a ferroelectric film on said first electrode;

forming a second electrode on said ferroelectric film;

forming a mask film on said second electrode, said mask film having a predetermined pattern;

etching said second electrode with said semiconductor substrate or a mounting electrode being set to a first temperature within a range of 350° C. to 450° C. using a first mixed gas including $Cl_2$ and at least $O_2$ at gas flow rates of 5/15 sccm and using said mask film as a mask, said semiconductor substrate being mounted on said mounting electrode;

etching said ferroelectric film with said semiconductor substrate or said mounting electrode being set to a second temperature within a range of 25° C. to 350° C. using a second mixed gas including $Cl_2$ and at least Ar at gas flow rates of 10/10 sccm and using said mask film as the mask, said second temperature being lower than said first temperature and the second mixed gas does not include a fluorine gas; and etching said first electrode with said semiconductor substrate or said mounting electrode being set to a third temperature within a range of 350° C. to 450° C. using a third mixed gas including $Cl_2$ and at least $O_2$ at gas flow rates of 5/15 sccm and using said mask film as the mask, said third temperature being approximately the same as said first temperature.

2. The method of manufacturing a semiconductor device according to claim 1, wherein said second electrode, said ferroelectric film, and said first electrode are continuously etched.

3. The method of manufacturing a semiconductor device according to claim 1, wherein an elevation angle of a side constructed from said second electrode, said ferroelectric film, and said first electrode with respect to a side closest to said semiconductor substrate of said first electrode is 80° or more.

4. The method of manufacturing a semiconductor device according to claim 3, wherein said mask film has a titanium film formed on said second electrode and a silicon oxide film formed on said titanium film.

5. The method of manufacturing a semiconductor device according to claim 4, wherein said second electrode and said ferroelectric film are etched by using said silicon oxide film as the mask, and said first electrode is etched by using said titanium film as the mask.

6. The method of manufacturing a semiconductor device according to claim 5, wherein said first electrode has an iridium film formed on said first insulation film, an iridium oxide film formed on said iridium film, and a platinum film formed on said iridium oxide film.

7. The method of manufacturing a semiconductor device according to claim 6, wherein a material of said ferroelectric film includes an SBT system compound or a PZT system compound.

8. The method of manufacturing a semiconductor device according to claim 1, wherein an etching apparatus having first and second chambers is used to etch said second electrode, said ferroelectric film and said first electrode, said second electrode and said first electrode are etched in said first chamber, and said ferroelectric film is etched in said second chamber.

9. The method of manufacturing a semiconductor device according to claim 8, wherein said semiconductor substrate is a semiconductor wafer.

10. The method of manufacturing a semiconductor device according to claim 8, further comprising ashing in a third chamber of said etching apparatus, before said etching said second electrode.

11. The method of manufacturing a semiconductor device according to claim 10, further comprising delivering said semiconductor substrate from a cassette to said etching apparatus.

12. The method of manufacturing a semiconductor device according to claim 1, wherein the first mixed gas also includes Ar at a gas flow rate of 10 sccm.

13. The method of manufacturing a semiconductor device according to claim 1, wherein the third mixed gas also includes Ar at a gas flow rate of 10 sccm.

14. The method of manufacturing a semiconductor device according to claim 1, wherein the second mixed gas also includes $O_2$.

* * * * *